3,180,733
United States Patent Office
Patented Apr. 27, 1965

3,180,733

NAPHTHOQUINONE DIAZIDE LITHOGRAPHIC MATERIAL AND PROCESS OF MAKING PRINTING PLATES THEREWITH

Wilhelm Neugebauer, Wiesbaden-Biebrich, and Fritz Endermann, Wiesbaden, Germany, assignors, by mesne assignments, to Azoplate Corporation, Murray Hill, N.J.

No Drawing. Filed July 29, 1963, Ser. No. 298,392
Claims priority, application Germany, Mar. 11, 1953, K 17,351
18 Claims. (Cl. 96—33)

This application is a continuation-in-part of co-pending application, Serial Number 553,392, filed December 15, 1955, which is, in turn, a continuation-in-part of co-pending application, Serial Number 415,146, filed March 9, 1954, and now abandoned.

The present invention relates to the field of photo-mechanical reproduction such as a planographic and planographic offset printing. It is more particularly concerned with a new presentized printing plate comprising as the light-sensitive substance a particular type of naphthokuinone-(1,2)-diazide-sulfonic ester, this new material being suitable for photomechanical transformation into planographic printing plates. Another object of this invention is a process for making a printing plate comprising the particular new type of light-sensitive substances. Still another object is the particular new type of light-sensitive substances.

Printing plates, especially those for planographic printing, have been prepared by coating a layer-support, specifically a metal plate or metal foil, e.g. an aluminum or zinc plate, with a layer of water-insoluble naphthoquinone-(1,2)-diazide-sulfonic acid acid ester, drying the coated layer, exposing the light-sensitive material thus obtained to light under a pattern, and developing the exposed layer to an image by means of dilute alkaline solutions, e.g. a dilute di-or trisodium-phosphate solution. If a positive pattern is used, the image obtained is a positive reproduction of the pattern and is receptive to greasy ink, so that copies of the pattern can be reprinted in a printing machine. Compounds containing several naphthoquinone-(1,2)-diazide-sulfonyl- residues in their molecules also are included within the group of naphthoquinone-(1,2)-diazide-sulfonic acid acid esters suitable for the production of printing plates.

The naphthoquinone-(1,2)-diazide-sulfonic acid esters referred to as above as being previously known do not contain free hydroxyl groups. It has now been found, that printing plates of outstanding value are obtained by a photomechanical process if the light-sensitive material used therein is produced from metal plates or metal foils (preferably aluminum plates or aluminum foils) and naphthoquinone-(1,2)-diazide-sulfonic acid esters having a specific constitution which includes free hydroxyl groups. The naphthoquinone-(1,2)-diazide-sulfonic acid esters, to be used according to the present invention, correspond to the general formula

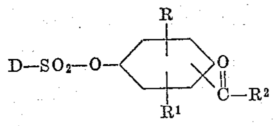

wherein D stands for a naphthoquinone-(1,2)-diazide group, R and $R^1$ are selected from the group consisting of hydrogen and hydroxyl, at least one of R and $R^1$ being hydroxyl and being in ortho-position to the carbonyl group and $R^2$ stands for a heterocyclic group.

The term "heterocyclic group" as used above and, as used hereinafter, is considered to include within its scope both substituted and unsubstituted heterocyclic groups.

The naphthoquinone-(1,2)-diazide-sulfonic acid esters corresponding to the above mentioned formula are water-insoluble. When used in making the presensitized printing plate, they are dissolved in organic solvents and then coated onto the layer support in a known manner. They are obtained by condensing, in an organic solvent (preferably dioxane) at room temperature, equimolecular quantities of a naphthoquinone-(1,2)-diazide-sulfonic acid chloride and a compound corresponding to one of the general formulae:

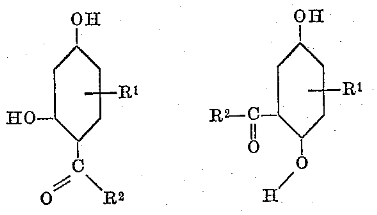

wherein $R^1$ is hydrogen or hydroxyl and $R^2$ is a heterocyclic group. The condensation takes place in the presence of alkali-bicarbonates or alkali carbonates, which are added to the reaction mixture in the form of aqueous solutions. To avoid the formation of a dye, the condensing agents may be added to the reaction mixtures only in a quantity such that the solvent in which the reaction takes place shows only a weakly alkaline or a neutral reaction after the condensation has been completed. Generally, alkali bicarbonates are preferred for use as condensing agents. For the condensation of naphthoquinone - (1,2) - diazide - 5 - sulfonic acid chloride with a derivative of the pyrogallol series, however, the use of alkali carbonates as condensating agents is advisable. In order to isolate the condensation product, the reaction solution is filtered with animal charcoal and the condensation product is precipitated by adding dilute hydrochloric acid to the filtered solution. After the condensation product is separated from the liquid by filtration and the remaining acid is removed by washing, the condensation product may be used immediately for the production of the light-sensitive layer.

The following method illustrates one method of preparing the naphthoquinone-(1,2)-diazide-sulfonic acid esters to be used according to the present invention:

27 g. (=1/10 mol) of naphthoquinone-(1,2)-diazide-(2) sulfonic acid chloride and 1/10 mol of the phenolic component, e.g. 23.6 g. of 2,3,4-trihydroxy-phenyl-(1)-thienyl-(2′-ketone are dissolved in 250 cc. of dioxane, and, while this is being stirred, 75 cc. of a 20% soda solution or 100 cc. of a saturated sodium-bicarbonate solution are added at room temperature during a period of 30 minutes. After some hours the condensation is completed. The reaction solution is agitated for some time with animal charcoal and drawn off. While being thoroughly stirred, the filtrate is poured into 5 liters of water, to which 50 cc. of concentrated hydrochloric acid have been added. The precipitated yellow-brown colored naphthoquinone-diazide-sulfonic acid ester is drawn off, washed free from acid by means of water, and dried.

The printing plate is produce photomechanically from the light-sensitive material, by exposing the light-sensitive material, by exposing the light-sensitive layer to a light image, e.g. under a pattern, and developing the exposed layer to an intensively yellow-colored image, by means of dilute alkaline solutions. The developed layer is then rinsed with water. By treating the imaged surface of the aluminum support with a solution of about 1% phosphoric acid which may contain dextrine or gum arabic, the aluminum is rendered water-receptive in the areas struck by light. These areas are hereinafter referred to as "non-imaged areas." The portions of the diazo compound remaining adherent to the support are inked with greasy ink. These latter portions constitute the image.

The areas of the support occupied by the non-decomposed diazo compound are hereinafter referred to as "imaged areas." Thus, from positive patterns, positive images are obtained, which may be used for reprinting in a printing machine.

In the following table there is set forth examples of the naphthoquinone-(1,2)-diazide sulfonic acid esters, corresponding to the general formulae mentioned above, which have been used according to the teaching of this invention for the production of the light-sensitive layer on metal sheets, especially on aluminum. The table includes data as to the melting points and the decomposition points of the compounds, the starting materials used for their production and the condensing agent preferred to be used, and the most suitable developer. The following abbreviations are use:

*a*=a 2% soda solution.
*b*=a 1.5% trisodium phosphate solution.

In the column headed "starting materials":

$D_4$ is the abbreviation for naphthoquinone-(1,2)-diazide-(2)-4-sulfonic acid chloride,
$D_5$ the abbreviation for naphthoquinone-(1,2)-diazide-(2)-5-sulfonic acid chloride.

TABLE

| Formula | Melting or decomposition point, °C. | Starting Materials | Condensing Agent | Developer |
|---|---|---|---|---|
| 1 | 111 | 2,4-dihydroxyphenyl-(1)-furyl-(2'(-ketone; $D_5$. | $NaHCO_3$ | b |
| 2 | 153 | 2,4-dihydroxyphenyl-(1)-furyl-(2')-ketone; $D_4$. | $NaHCO_3$ | b |
| 3 | 235 | 2,3,4-trihydroxyphenyl-(1)-furyl-(2')-ketone; $D_5$. | $Na_2CO_3$ | a |
| 4 | 144 | 2,4-dihydroxyphenyl-(1)-benzofuryl-(2')-ketone; $D_5$. | $NaHCO_3$ | b |
| 5 | 138 | 2,3,4-trihydroxyphenyl-(1)-benzofuryl-(2')-ketone; $D_4$. | $Na_2CO_3$ | b |
| 6 | 142 | 2,3,4-trihydroxyphenyl-(1)-benzofuryl-(2')-ketone; $D_5$. | $Na_2CO_3$ | b |
| 7 | 128 | 2,3,4-trihydroxyphenyl-(1)-thienyl-(2')-ketone; $D_5$. | $Na_2CO_3$ | b |
| 8 | 108 | 2,3,4-trihydroxyphenyl-(1)-thienyl-(2')-ketone; $D_4$. | $Na_2CO_3$ | b |
| 9 | 138 | 2,4-dihydroxyphenyl-(1)-thienyl-(2')-ketone; $D_5$. | $NaHCO_3$ | b |
| 10 | 113 | N-phenyl-5-methyl-pyrazolyl-(3)-2', 3', 4'-trihydroxyphenyl-(1')-ketone; $D_5$. | $Na_2CO_3$ | b |

Some of the ketones among the starting materials are unknown substances. In the following the ketones which are believed to be unknown are listed along with the melting points and colors:

2,3,4-trihydroxyphenyl-(1)-benzofuryl-(2')-ketone, 157° C., light yellow
2,3,4-trihydroxyphenyl-(1)-thienyl-(2')-ketone, 141° C., dark yellow
2,4-dihydroxyphenyl-(1)-benzofuryl-(2')-ketone, 145° C., light yellow
2,4-dihydroxyphenyl-(1)-thienyl-(2')-ketone, 124° C., light yellow The first and second thereof have been prepared as follows:

One and a half to two moles of $AlCl_3$ are reacted with 1 mole of pyrogallol by heating them in nitrobenzene on a water bath. After completion of HCl-generation, 1 mole of coumarilic acid chloride or 1 mole of thienyl chloride are added, respectively, and the mixture is heated for 8 to 9 hours to 80° C. After cooling, the mixture is acidified by the addition of hydrochloric acid and then freed from nitrobenzene by steam distillation. The solid residue is boiled several times in water. After cooling, the respective ketones precipitate in the form of yellow crystals. When recrystallized from benzene, they have the melting points stated above.

The third and fourth of the above ketones have been prepared as follows:

One mole of coumarilic acid nitrile or 1 mol of 2-cyanothiophene, respectively, are dissolved in ether with 1 mole of resorcinol. To this mixture, $ZnCl_2$ is added as a catalyst, and hydrochloric acid is introduced at 15–20° C. After 24 hours, the precipitated ketimine hydrochloride is dissolved in ice water, ether is separated off, and the aqueous solution is boiled for 30 minutes under reflux. An oil precipitates which solidifies upon cooling. The ketones thus obtained may be recrystallized from benzene and have the melting points stated above.

The following formulae are referred to in the above table, and are set forth to exemplify several of the compounds within the scope of the invention.

(1)

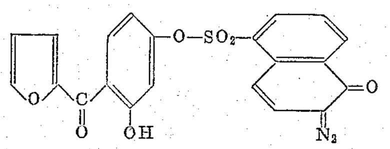

(2)

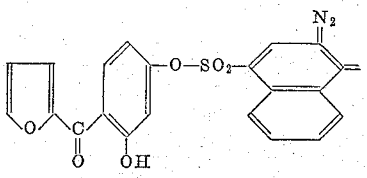

(3)

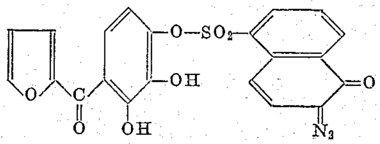

(4)

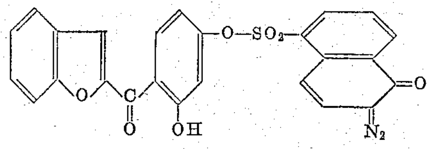

(5)

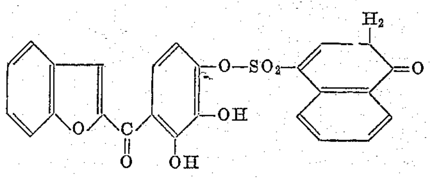

(6)

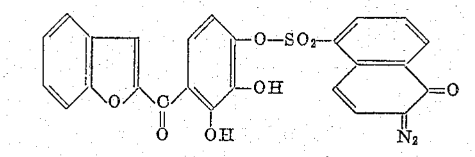

(7)

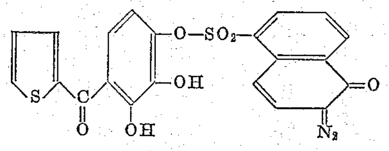

(8)

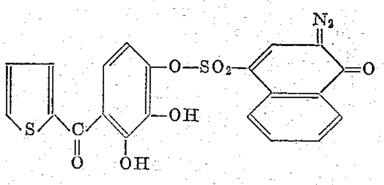

(9)

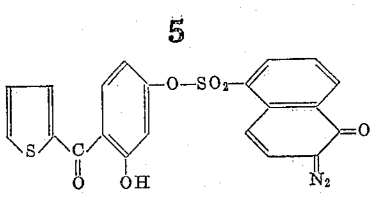

(10)

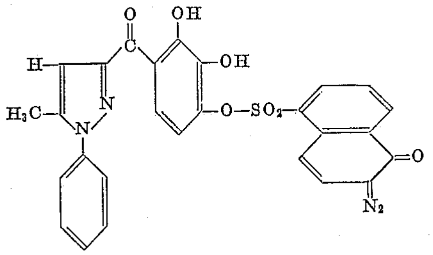

The light-sensitive aluminum plates or aluminum foils produced according to the invention, distinguish themselves from previously known products of this kind by the fact that their light-sensitivity is greater and that most of them do not produce the undesired so-called "glass effect" when used. By the term "glass effect" is meant the phenomenon occurring in practicing the above described process resulting in ink-receptivity of those areas of the printing plate, which during the exposure to light have come into contact with the glass plate of the copying apparatus. Those areas that are not covered by the pattern contact the glass of the copying frame and often show a feeble coloring. This coloring is very difficult to remove and becomes obvious when the printing plates are used for printing because it causes a coloring of the background of the reprinted images. It has been found that when using naphthoquinone diazide sulfonic acid esters which are attended with the diagreeable "glass effect," this undesired phenomenon may be obviated by using as the coating for aluminum foils a mixture of these esters with a naphthoquinone-(1,2)-diazide sulfonic acid ester of the present invention, particularly an ester formed with a compound of the pyrogallol series.

From a consideration of the prior art and previous experience it was surprising to learn that the naphthoquinone-(1,2)-diazide-sulfonic acid esters, of the above-mentioned general formula, can be used for the purpose of the invention. Because of the free hydroxyl groups present in their molecules it was supposed that such esters would be dissolved on treatment with alkaline liquid, i.e. that the diazo compound not struck by light during the exposure would be dissolved during the alkaline development. This result was thought to be existent especially when using sulfonic acid esters which are formed by condensation with derivatives of trihydroxybenzene. By experiments it was determined that the resistance to dissolution by alkaline liquids, of the non-light decomposed diazo compound of the invention and the adhesion of the developed image to the aluminum surface are excellent. Particularly good results are obtained when using condensation products obtained from pyrogallol derivatives.

The following examples are inserted merely for the purpose of illustrating the present invention. Restriction of the scope of the invention to the contents of the examples is not intended.

*Examples*

(1) 2 g. of the naphthoquinone-(1,2)-diazide-(2)-sulfonic acid ester of the Formula 1 are dissolved in 100 cc. of glycol-monomethyl-ether. Then a mechanicaly roughened aluminum foil is coated in a known manner with the filtrated solution, and the thus produced layer is dried by means of hot air.

For the production of a printing plate, the layer-side of the foil is exposed to light under a pattern and then treated with a cotton swab, which is soaked in a solution of about 1.5% trisodium phosphate. A yellow colored image of the pattern appears in the areas not hit by light. After rinsing the foil with water, the image is prepared for printing, by wiping it over was a cotton swab, which is soaked in a 1% phosphoric acid solution containing gum arabic or dextrin.

Equal results have been obtained when using, instead of the above ester of the Formula 1, 2 g. of any of the esters of Formulae 2 to 10.

(2) 1 g. of the naphthoquinone-(1,2)-diazide-(2)-5-sulfonic acid monoester corresponding to Formula 3 and 1 g. of the naphthoquinone-(1,2)-diazide-(2)-5-sulfonic acid bisester of 2,2'-dihydroxy-dinaphthyl-1,1'-methane having the formula

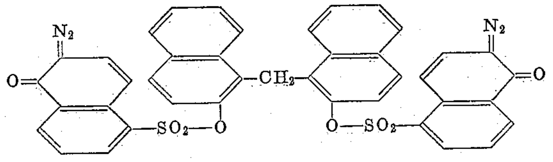

are dissolved in 100 cc. of glycol-monomethylether. An aluminum foil is then coated with the solution and the layer is dried. The production of a printing foil is effected by developing the layer-side after it has been exposed to light under a pattern, following the procedure described in Example 1.

The printing foil, which is produced following the above-mentioned directions, does not show any tendency to greasy ink-receptivity in the areas, which came into direct contact with the glass during the exposure to light in the copying apparatus, while an aluminum foil coated only with the bis-ester of the above-described formula frequently shows undesired ink receptivity in the same areas.

(3) The naphthoquinone-(1,2)-diazide sulfonic acid esters according to the Formulae 3 and 5 are made up into a mixture of a mixing proportion of 2:1 by weight. Two grams of said mixture are dissolved in 100 cc. of glycol-monomethyl-ether, and an aluminum foil is coated with the solution thus prepared as described in Example 1.

Equal results have been obtained when using instead of the above mixture of esters 2 g. of another mixture of two esters according to Formulae 1 to 10.

(4) The surface of a grained zinc foil is cleaned by scrubbing with an aqueous solution containing 5% of alum and 5% of glacial acetic acid and rinsing with water. The foil is then dried by means of warm air as customary in the printing art. Subsequently, the zinc foil is coated with a 4% by weight solution of the compound corresponding to the Formula 1 in glycol monomethyl ether. The thus sensitized foil is then dried by means of warm air.

After exposing the foil under a transparent pattern, it is developed by swabbing with a 2.5% aqueous solution of trisodium phosphate. A yellow colored image of the pattern becomes visible on the foil in those areas which were not struck by light. The foil is then rinsed with water and finished for printing as usual.

Equal results have been obtained when using, instead of the above solution of the ester of Formula 1, a 4% by weight solution of any of the esters of Formulae 2 to 10.

(5) The surface of a grained zinc foil is cleaned by scrubbing with an aqueous solution containing 5% of alum and 5% of glacial acetic acid and rinsing with water. The foil is then dried by means of warm air as customary in the printing art. Subsequently, the zinc foil is coated with a 4% by weight solution of the compound corresponding to the Formula 1 in glycol monomethyl ether. The thus sensitized foil is then dried by means of warm air.

After exposing the foil under a transparent pattern, it is developed by swabbing with a 2.5% aqueous solution of trisodium phosphate. A yellow colored image of the pattern becomes visible on the foil in those areas which were not struck by light. The foil is then rinsed with water and finished for printing as usual.

Equal results have been obtained when using, instead of the above solution of the ester of the Formula 1, a 4% by weight solution of any of the esters of Formulae 2 to 10.

(6) An unsensitized paper-printing foil, for instance the foil manufactured by the S. D. Warren Co. in Boston (Mass.), according to U.S. Patent No. 2,681,617, is coated with a 2% by weight solution of the compound of Formula 1 in glycol monomethyl ether, and the foil is then dried with warm air.

A paper foil thus sensitized is exposed to light under a transparent pattern and the light-decomposition product of the diazo compound is then removed in the light-struck areas by wiping the foil over with a cotton swab soaked in an about 2.5% aqueous solution of trisodium phosphate. The surplus developer is removed with a cotton swab. The foil is then finished for printing by wiping over with a wetting agent, as for instance "Platex Green," a product of the Addressograph-Multigraph Corp., Cleveland (Ohio). The foil is then inked either manually or in the printing machine. Those areas of the foil which were not struck by light are receptive to greasy ink.

Equal results have been obtained when using, instead of the above solution of the ester of the Formula 1, a 2% by weight solution of any of the esters of Formulae 2 to 10.

We claim:

1. A compound having the formula

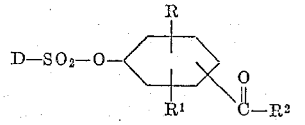

in which D is a naphthoquinone-(1,2)-diazide group, R and $R^1$ are selected from the group consisting of hydrogen and hydroxyl, at least one of R and $R^1$ being hydroxyl and being in ortho-position to the carbonyl group, and $R^2$ is a 5-membered heterocyclic group.

2. A compound having the formula

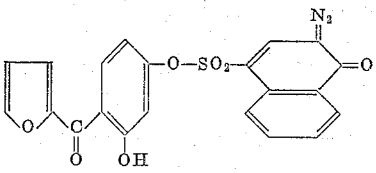

3. A compound having the formula

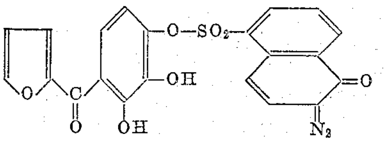

4. A compound having the formula

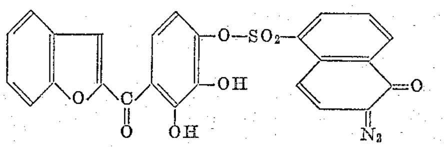

5. A compound having the formula

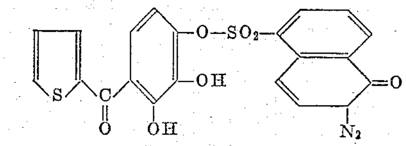

6. A compound having the formula

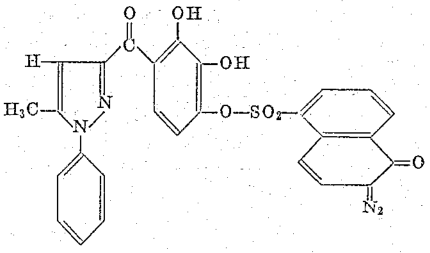

7. A presensitized printing plate comprising a base material having a coating thereon, the coating comprising a component having the formula

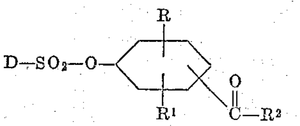

in which D is a naphthoquinone-(1,2)-diazide group, R and $R^1$ are selected from the group consisting of hydrogen and hydroxyl, at least one of R and $R^1$ being hydroxyl and being in ortho-position to the carbonyl group, and $R^2$ is a 5-membered heterocyclic group.

8. A presensitized printing plate comprising a base material having a coating thereon, the coating comprising a compound having the formula

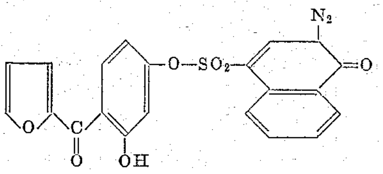

9. A presenitized printing plate comprising a base material having a coating thereon, the coating comprising a compound having the formula

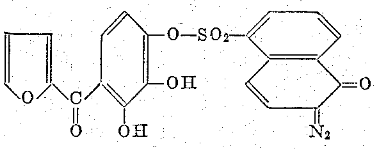

10. A presensitized printing plate comprising a base material having a coating thereon, the coating comprising a compound having the formula

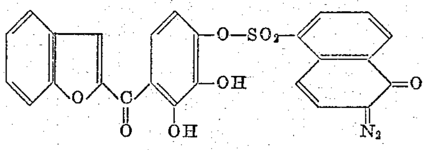

11. A presensitized printing plate comprising a base material having a coating thereon, the coating comprising a compound having the formula

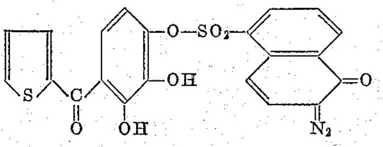

12. A presensitized printing plate comprising a base material having a coating thereon, the coating comprising a compound having the formula

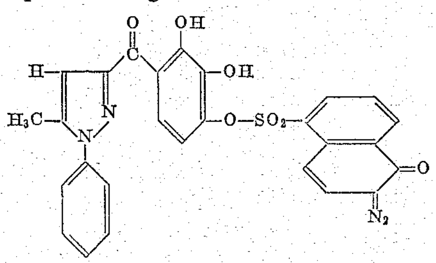

13. A process for making a printing plate, which comprises exposing a coated base material to light under a master, the coating comprising a compound having the formula

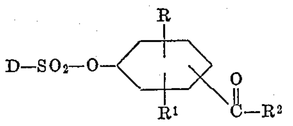

in which D is a naphthoquinone-(1,2)-diazide group, R and $R^1$ are selected from the group consisting of hydrogen and hydroxyl, at least one of R and $R^1$ being hydroxyl and being in ortho-position to the carbonyl group, and $R^2$ is a 5-membered heterocyclic group, and treating the exposed coating with a weakly alkaline developing solution.

14. A process for making a printing plate, which comprises exposing a coated base material to light under a master, the coating comprising a compound having the formula

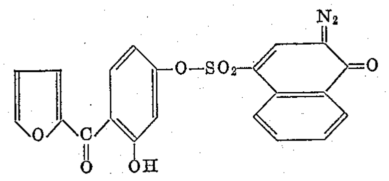

and treating the exposed coating with a weakly alkaline developing solution.

15. A process for making a printing plate, which comprises exposing a coated base material to light under a master, the coating comprising a compound having the formula

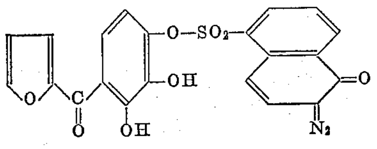

and treating the exposed coating with a weakly alkaline developing solution.

16. A process for making a printing plate, which comprises exposing a coated base material to light under a master, the coating comprising a compound having the formula

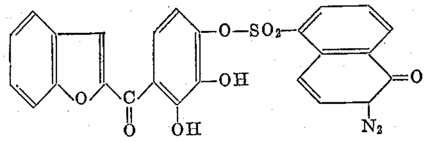

and treating the exposed coating with a weakly alkaline developing solution.

17. A process for making a printing plate, which comprises exposing a coated base material to light under a master, the coating comprising a compound having the formula

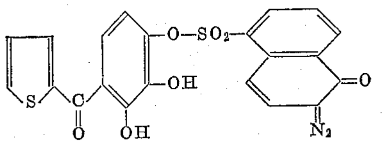

and treating the exposed coating with a weakly alkaline developing solution.

18. A process for making a printing plate, which comprises exposing a coated base material to light under a master, the coating comprising a compound having the formula

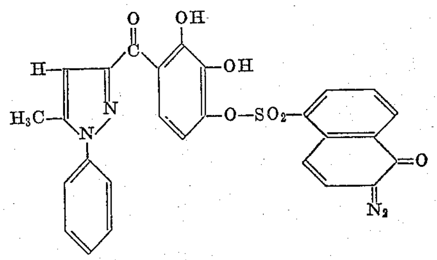

and treating the exposed coating with a weakly alkaline developing solution.

No references cited.

NORMAN G. TORCHIN, *Primary Examiner.*